(12) United States Patent
Tai et al.

(10) Patent No.: US 6,968,280 B2
(45) Date of Patent: Nov. 22, 2005

(54) METHOD FOR ANALYZING WAFER TEST PARAMETERS

(75) Inventors: Hung-En Tai, Taipei Hsien (TW); Ching-Ly Yueh, Hsin-Chu (TW)

(73) Assignee: Powerchip Semiconductor Corp., Hsin-Chu (TW)

(*) Notice: Subject to any disclaimer, the term of this patent is extended or adjusted under 35 U.S.C. 154(b) by 106 days.

(21) Appl. No.: 10/249,213

(22) Filed: Mar. 24, 2003

(65) Prior Publication Data

US 2004/0193381 A1    Sep. 30, 2004

(51) Int. Cl.[7] .................................... G06F 19/00
(52) U.S. Cl. ........................ 702/84; 702/183; 438/17
(58) Field of Search ................. 702/35–36, 40, 702/57–59, 81–84, 117–118, 179, 183, 185; 700/108–110, 700/115–116, 119, 121; 324/527–528, 537, 324/763–765; 438/14, 17–18

(56) References Cited

U.S. PATENT DOCUMENTS

| | | | | |
|---|---|---|---|---|
| 6,487,511 B1 * | 11/2002 | Wooten | | 702/84 |
| 6,507,933 B1 * | 1/2003 | Kirsch et al. | | 716/4 |
| 6,546,308 B2 * | 4/2003 | Takagi et al. | | 700/121 |
| 6,618,682 B2 * | 9/2003 | Bulaga et al. | | 702/84 |
| 6,711,453 B2 * | 3/2004 | Yamada et al. | | 700/121 |
| 6,716,648 B2 * | 4/2004 | Iriki | | 438/14 |
| 6,728,588 B2 * | 4/2004 | Cho et al. | | 700/110 |
| 6,766,283 B1 * | 7/2004 | Goldman et al. | | 703/2 |
| 2004/0088068 A1 * | 5/2004 | Kadosh | | 700/108 |
| 2004/0138856 A1 * | 7/2004 | Tai et al. | | 702/185 |

* cited by examiner

*Primary Examiner*—Carol S. W. Tsai
*Assistant Examiner*—Mary Catherine Baran
(74) *Attorney, Agent, or Firm*—Winston Hsu

(57) ABSTRACT

A plurality of lots of wafers, each lot of wafers having a lot number and each wafer of each lot having at least one test parameter generated by performing at least one wafer test item stored in a database, are divided into a high yield group and a low yield group. By analyzing the wafer test parameters of the wafers in the high yield group, a first standard value within a first range is obtained. A first comparison step is then performed to compare each wafer test parameter of each lot in the low yield group with the first standard value and delete lot numbers of lots with wafer test parameters within the first range. Finally, a first amount of residual lots in the low yield group is determined. In response to the first amount of residual lots in the low yield group not equaling to zero, a first searching step is performed to which item of sample test items, in-line QC items and process step items is related to the wafer test item of each residual lot in the low yield group in the database.

32 Claims, 13 Drawing Sheets

METHOD FOR ANALYZING WAFER TEST PARAMETERS

BACKGROUND OF INVENTION

1. Field of the Invention

The present invention relates to a method for analyzing parameters during the production of wafers, and more specifically, to a method of analyzing wafer test parameters.

2. Description of the Prior Art

In the semiconductor industry, numerous manufacturing processes, such as lithography, etching, an ion implantation processes, are necessarily performed by utilizing different semiconductor machines to produce semiconductor products. It is therefore a major task to improve the production efficiency and the performance of the product by regularizing daily operation, increasing production yield, detecting and eliminating defects during manufacturing, and periodically maintaining facilities for production, so as to meet the requirements of customers. Generally, defects during manufacturing can be detected by analyzing parameters of in-line quality control (in-line QC) items, defect inspection items, sample test items, wafer test items and final test items. Among these parameters, the wafer test parameters are obtained by performing a pause refresh test, a function test or a power supply current test ($I_{DDQ}$ test).

Please refer to FIG. 1 and FIG. 2, which respectively represent a flow diagram of method of inspecting lots of wafers 20 and a schematic top view of a wafer 20 with defects according to the prior art. As shown in FIG. 1 and FIG. 2, the wafer 20 with defects are divide into multiple of dies and comprises a plurality of defective dies 21 and a plurality of non-defective dies 22, which are respectively represented by black and white blocks in FIG. 2.

At the beginning of the method, a step 101 is utilized by an inspector to perform wafer test items, comprising the pause refresh test, function test and power supply current test, on lots of wafers 20. A step 102 is then utilized to find out the wafers 20 with failed results. Thereafter, the inspector performs a step 103 to determine manufacturing processes, such as the lithography, etching and ion implantation process, and corresponding machines that cause failed results on the selected wafers 20 according to the distribution of the defective dies on each selected wafers and his/her experiences.

Finally, the inspector performs a step 104 to inspect and maintain those manufacturing machines determined in the step 103 so as to eliminate defects in production of subsequent lots of wafers 20.

However, since the inspector analyzes the distribution of the defective dies 21 to determine the abnormal manufacturing machines and process steps in the step 103 by his/her personal experiences, the accuracy of the analyzing results is not reliable. Therefore, engineers on the production line cannot immediately determine abnormal machines and process steps in a systematical manner as defects occur during manufacturing. As a result, the manufacturing efficiency is reduced, and the production cost is increased as well.

SUMMARY OF INVENTION

It is therefore a primary object of the present invention to provide a method for analyzing wafer test parameters of a plurality of lots of wafers so as to immediately and accurately determine abnormal manufacturing processes and corresponding machines as defects are found during production.

According to the claimed invention, each lot of the wafers comprises a lot number, and each wafer of each lot comprises at least one test parameter generated by performing at least one wafer test item stored in a database. In addition, parameters related to at least one sample test item, one in-line quality control (QC) item and one process step item related to the wafer test item are stored in the database as well. The lots of wafers are divided into at least a high yield group and a low yield group based on yield of the lots, and a first standard value within a first range is obtained by analyzing the wafer test parameters of the wafers in the high yield group. By performing a first comparison step to compare each wafer test parameter of each lot in the low yield group with the first standard value, lot numbers of lots with wafer test parameters within the first range are deleted. Finally, a first amount of residual lots in the low yield group is determined after the first comparison step. In response to the first amount of residual lots in the low yield group not equaling to zero, a first searching step is performed to determine which item of the sample test items, the in-line QC items and the process step items is related to the wafer test item of each residual lot in the low yield group in the database.

It is an advantage of the present invention against the prior art that the high yield group is utilized as a control group with data of parameters of the wafer test items and the items related to the wafer test items stored in the data base. By performing a commonality analyzing method in the method for analyzing wafer test parameters provided in the present invention, the most possible abnormal manufacturing machines and process steps utilized for the production of the wafers with failed results are selected. Therefore, misjudgment towards manufacturing machines and process steps made by the unsystematic analyzing method in the prior art is prevented. Consequently, the manufacturing efficiency is improved, and the production cost is reduced as well.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
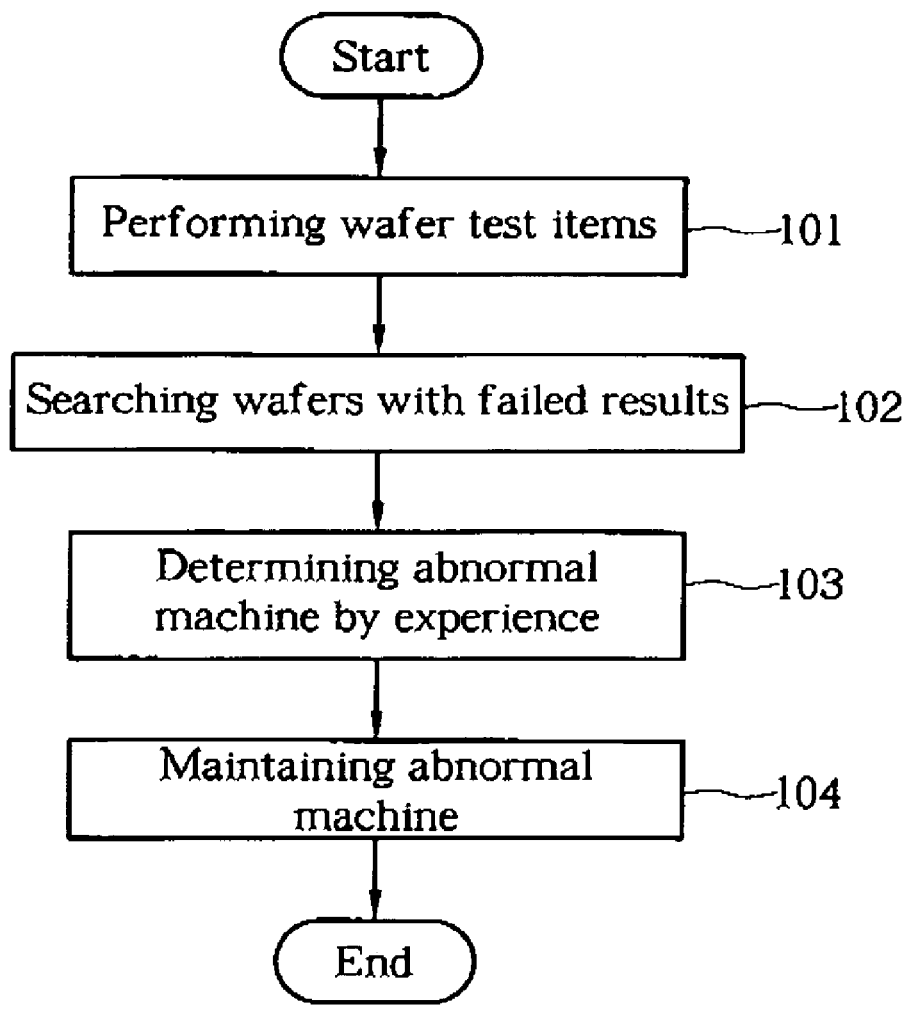
FIG. 1 is a flow diagram of method of inspecting lots of wafers according to the prior art.
Figure 2:
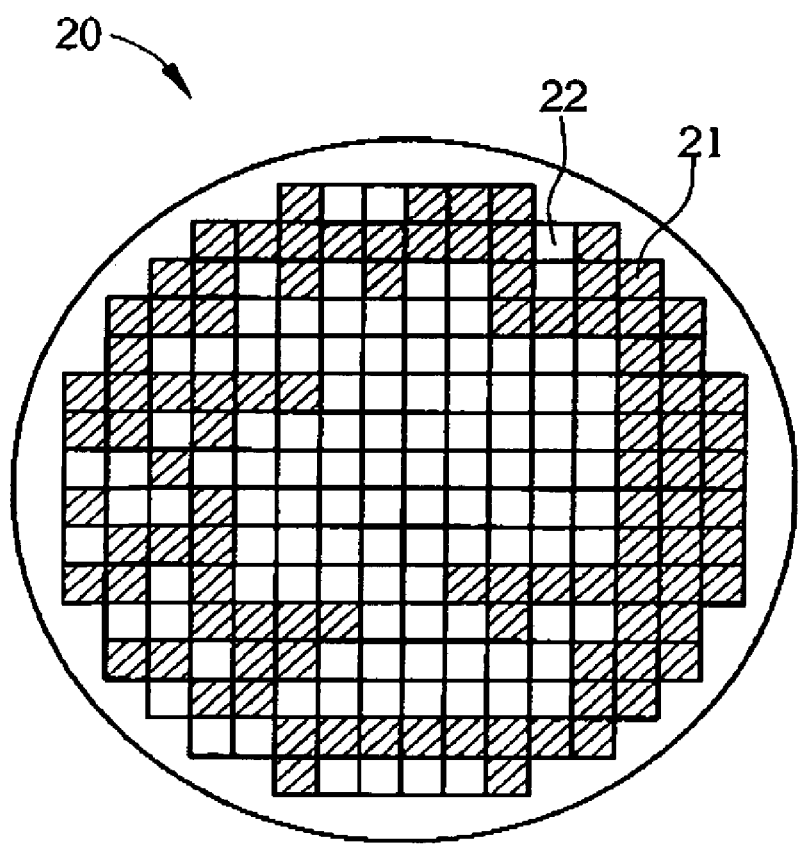
FIG. 2 is a schematic top view of a wafer 20 with defects according to the prior art.
Figure 3:
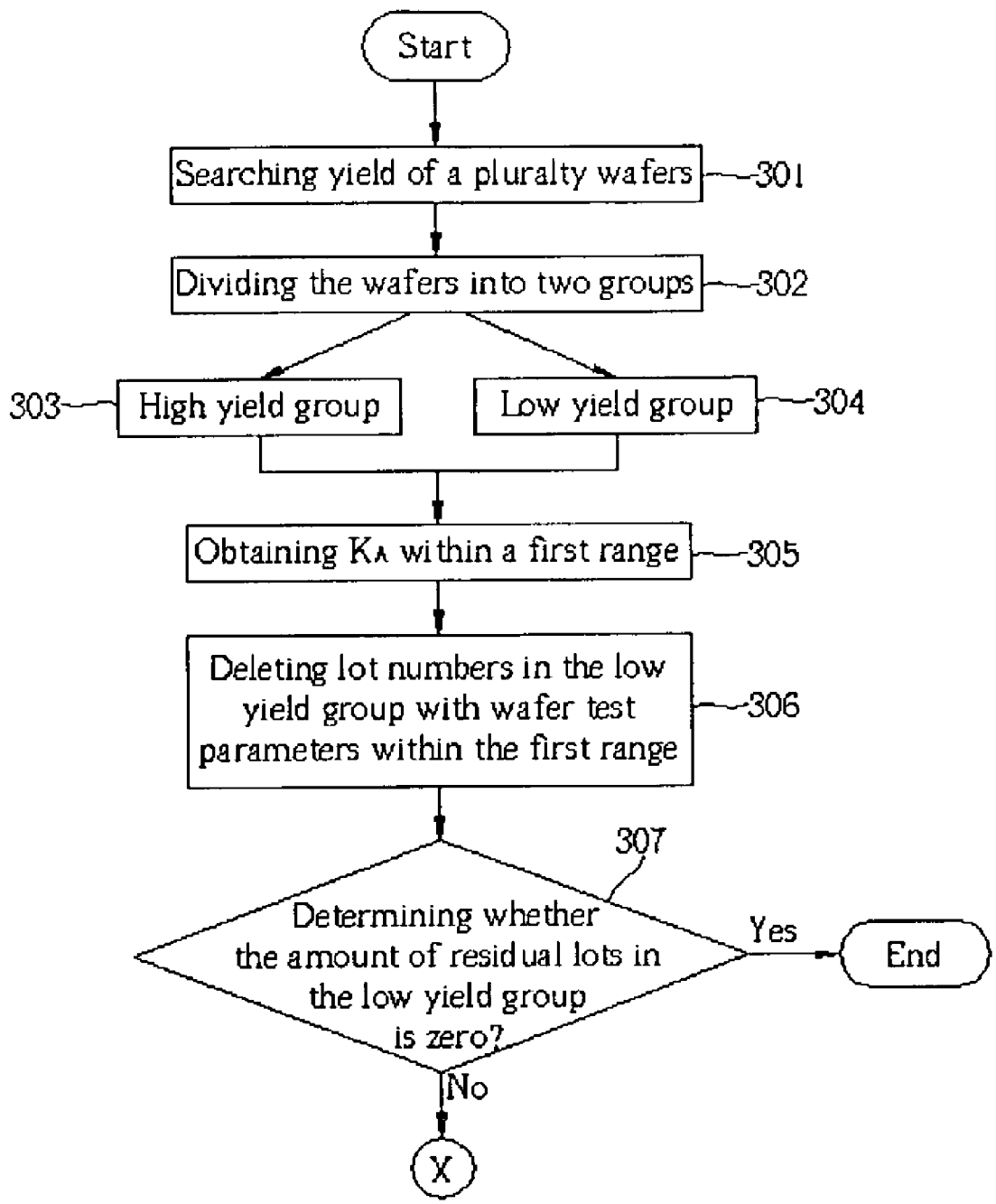
FIG. 3 to FIG. 5 are flow diagrams of the first embodiment of the method for analyzing wafer test parameters of a plurality of lots of wafers according to the present invention.
Figure 4:
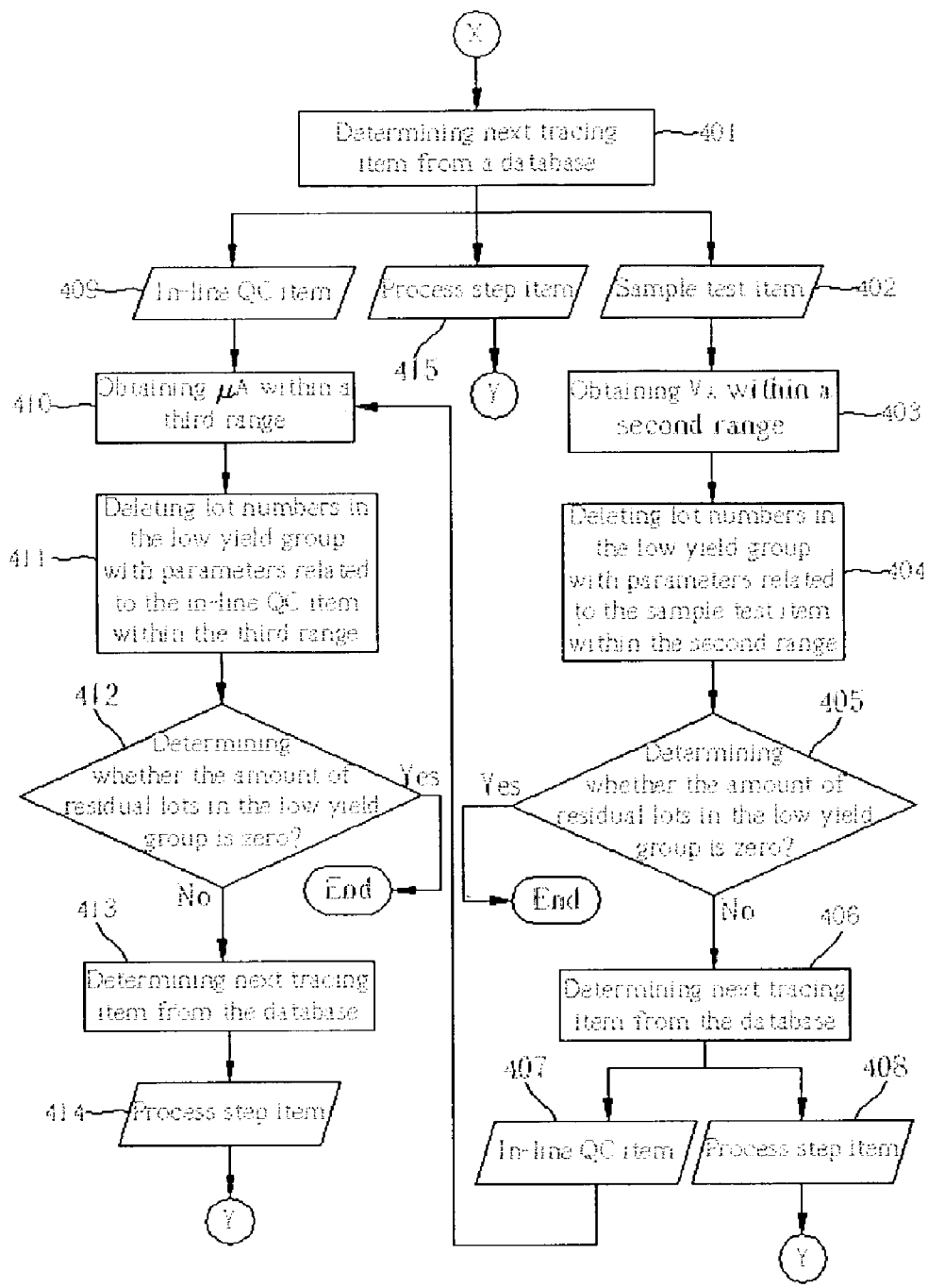
Figure 5:
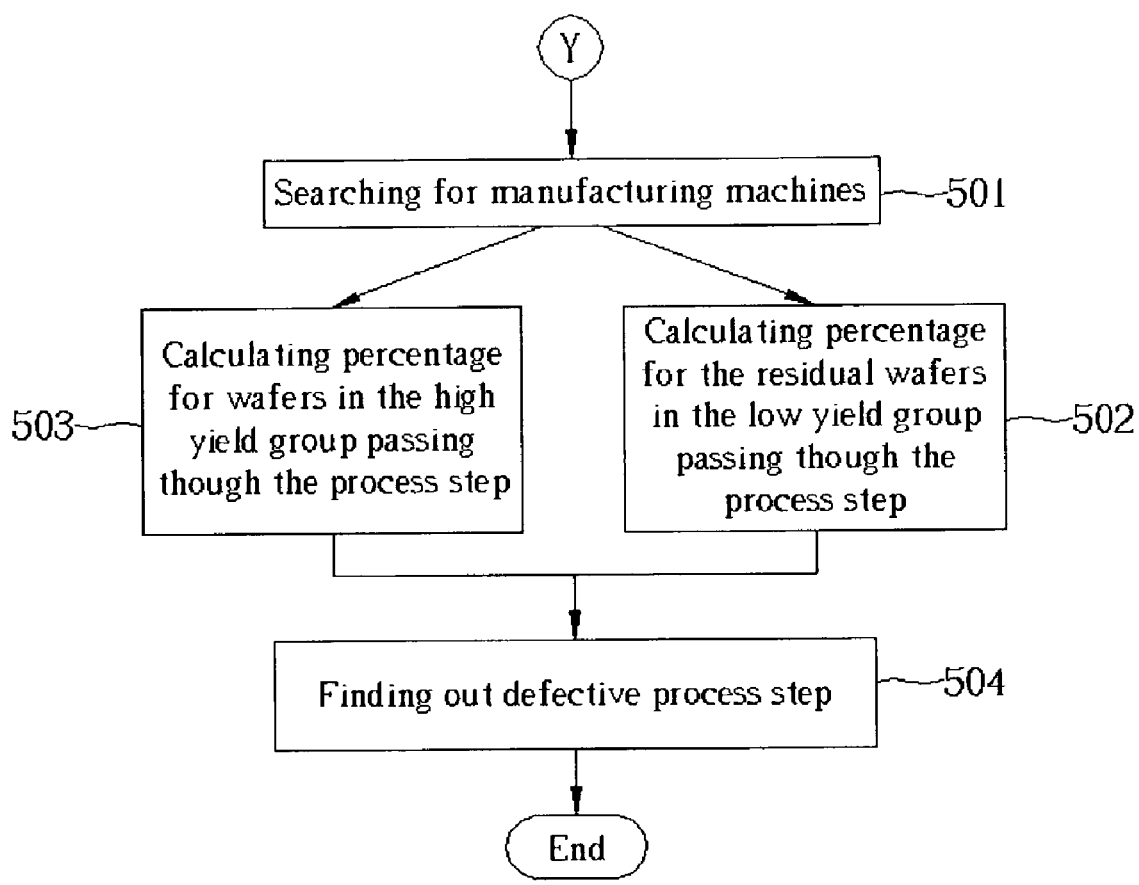

Please refer to FIG. 3 to FIG. 5 of flow diagrams of the first embodiment of a method for analyzing wafer test parameters of a plurality of lots of wafers 80 according to the present invention. Each lot of the wafers 80 comprises a lot number, each wafer of each lot is processed by a plurality of process steps, and each of the process steps is performed by utilizing a corresponding manufacturing machine. Each die on each wafer 80 of each lot comprises at least one wafer test parameter generated by performing at least one wafer test item A, such as an electrical test with a control specification, stored in a database. The parameter of the electrical test of the wafer 80 is defined as a ratio of number of dies on the wafer 80 passing the electrical test to the total number of the dies on the wafer 80, and the parameter of the electrical test of the lot of wafer 80 is defined as a ratio of number of wafers 80 in the lot passing the electrical test to the total number of the wafer 80 in the lot. In addition, parameters related to at least one sample test item, one in-line quality control (QC) item and one process step item related to the wafer test item A are stored in the database as well.

As shown in FIG. 3, a step 301 is performed to search yield of the plurality lots of the wafers 80. A step 302 is then performed to divide the plurality of lots of the wafers 80 into a high yield group and a low yield group based on yield of the lots of the wafers 80, as shown in blocks 303 and 304 in FIG. 3. The yield of a certain lot of wafers 80 is defined as a percentage of wafers 80 that pass a plurality of test items, including wafer test items, in-line quality control (in-line QC) items and sample test items, in the certain lot.

A step 305 is then performed to obtain a first standard value $K_A$ within a first range by analyzing the wafer test parameters of the wafers 80 in the high yield group related to a wafer test item A. By using $K_A$ as a reference, a step 306 is performed to compare each wafer test parameter of each lot in the low yield group related to the wafer test item A with the first standard value $K_A$ and delete lot numbers of lots in the low yield group with wafer test parameters within the first range. A step 307 is then performed to determine whether the amount of residual lots of wafers 80 in the low yield group is zero or not.

In case that the amount of residual lots of wafers 80 in the low yield group is not equal to zero, it is reasonable to assume that the yield of the residual lots of wafers 80 in the low yield group lower than $K_A$ is due to the failing on the wafer test item A of the residual lots, and this failing on the wafer test item A might be due to either one of the sample test item, in-line QC item or process step item related to the wafer test item A. As shown in FIG. 4, a step 401 is therefore performed by either an engineer or a computer to determine the next tracing item according to the database.

If the wafer test item A is determined to be related to the sample test item 402 in the step 401, a step 403 is performed to analyze the parameters related to the sample test item of the wafers 80 in the high yield group, obtaining a second standard value $v_A$ within a second range. A step 404 is then performed to compare the parameters of sample test item of each residual lot in the low yield group after the step 306 with the second standard value $v_A$, so as to delete lot numbers of residual lots with parameters related to the sample test item within the second range. A step 405 is performed thereafter to determine whether the amount of residual lots of the wafers 80 in the low yield group is zero or not.

In case that the amount of residual lots of wafers 80 in the low yield group is not equal to zero, it is reasonable to assume that the yield of the residual lots of wafers 80 in the low yield group lower than $K_A$ is due to the failing on the wafer test item A of the residual lots, and this failing on the wafer test item A might be due to either one of the in-line QC item or process step item related to the sample test item. A step 406 is therefore performed by either an engineer or a computer to determine the next tracing item according to the database. If the sample test item is determined to be related to the process step item 408 in the step 406, a step 501 is then performed; if the sample test item is determined to be related to the in-line QC test item 407 in the step 406, a step 410 is then performed.

If the wafer test item A is determined to be related to the in-line QC item 409 in the step 401, the step 410 is performed to analyze the parameters related to the in-line item of the wafers 80 in the high yield group, obtaining a third standard value $\mu_A$ within a third range. A step 411 is then performed to compare the parameters of the in-line QC item of each residual lot in the low yield group after either the step 306 or the step 404 with the third standard value $\mu_A$, so as to delete lot numbers of residual lots with parameters related to the in-line QC item within the third range. A step 412 is performed thereafter to determine whether the amount of residual lots of the wafers 80 in the low yield group is zero or not.

In case that the amount of residual lots of wafers 80 in the low yield group is not equal to zero, it is reasonable to assume that the yield of the residual lots of wafers 80 in the low yield group lower than $K_A$ is due to the failing on the wafer test item A of the residual lots, and this failing on the wafer test item A might be due to the process step item. A step 413 is therefore performed by either an engineer or a computer to determine the next tracing item according to the database. If the in-line QC item is determined to be related to the process step item 414 in the step 413, the step 501 is then performed.

As shown in FIG. 5, the step 501 is then performed to search the database for process step utilized for the production of the wafers 80 in either the high yield group or the low yield group. A step 502 and a step 503 are simultaneously performed thereafter. The step 502 is employed to calculate percentage of the searched process steps utilized for the production of the residual lots of wafers 50 after the steps 306, 404 or 411, and the step 503 is employed to calculate percentage of the searched process steps utilized for the production of the lots of wafers 80 in the high yield group. By performing a commonality analyzing method, the most possible process steps utilized for the production of residual lots of wafers 50 after the steps 306, 404 and 411, which are the most possible process steps that lead to defects on the wafers 80, can be found.

Figure 6:
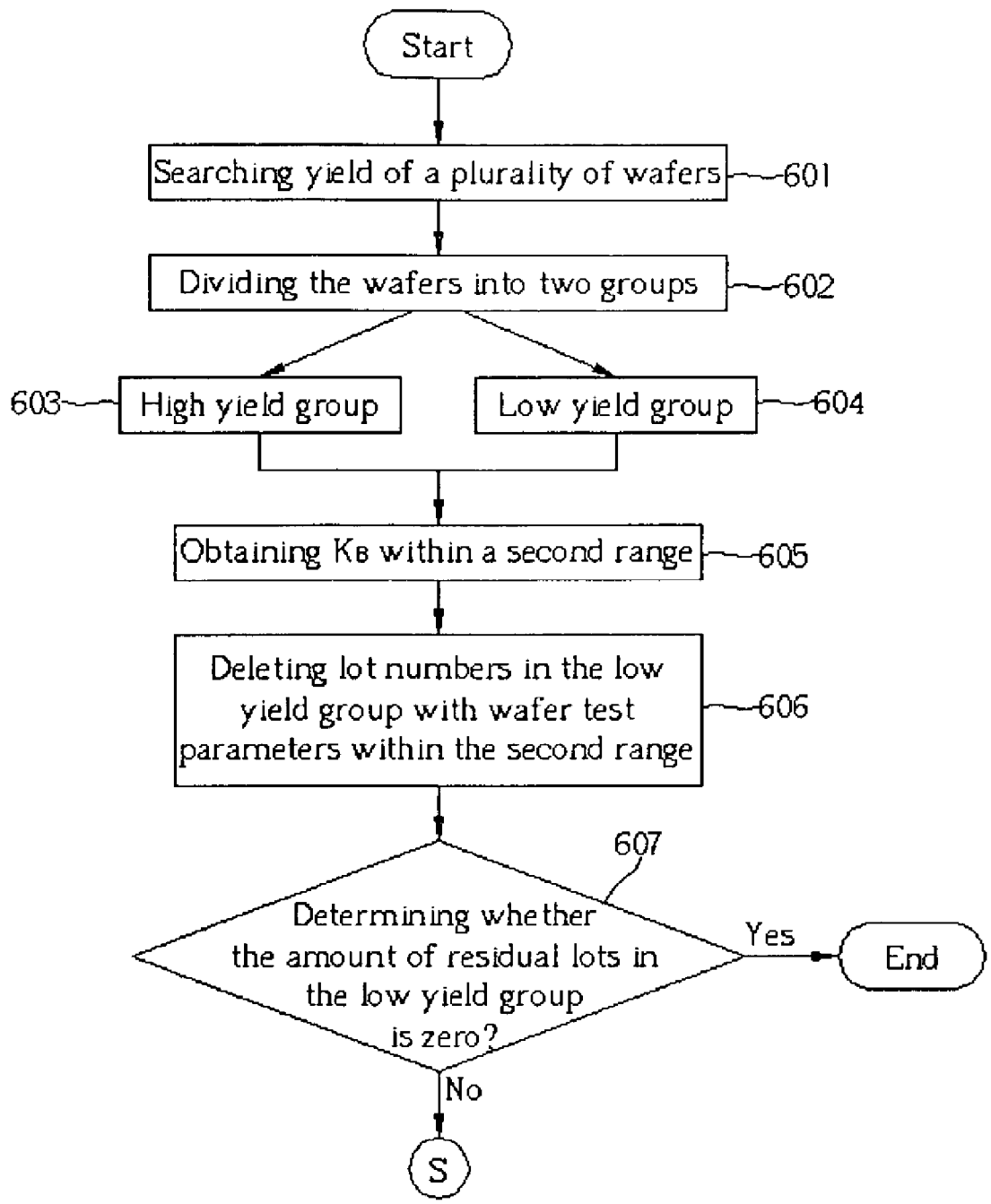
FIG. 6, FIG. 7, FIG. 9 and FIG. 10 are flow diagrams of the second embodiment of the method for analyzing wafer test parameters of a plurality of lots of wafers according to the present invention.

Please refer to FIG. 6, FIG. 7, FIG. 9 and FIG. 10 of flow diagrams of the second embodiment of a method for analyzing wafer test parameters of a plurality of lots of wafers 80 according to the present invention, wherein the wafer test parameters are generated by performing a wafer test item B. As shown in FIG. 6, steps 601 to 607 are similar to the steps 301 to 307 shown in FIG. 3, and are therefore neglected for simplicity of description.

Figure 7:
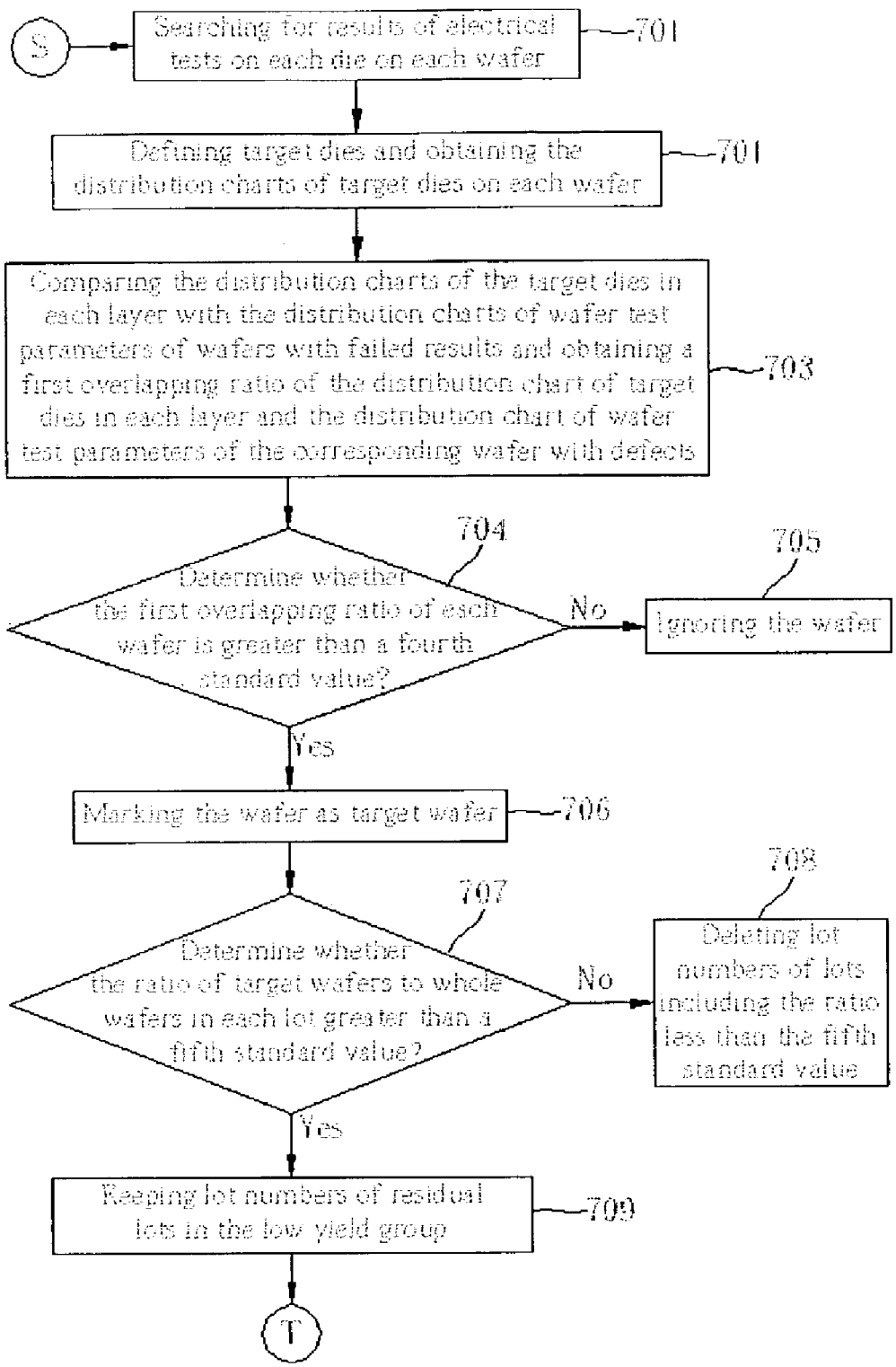
Figure 8:
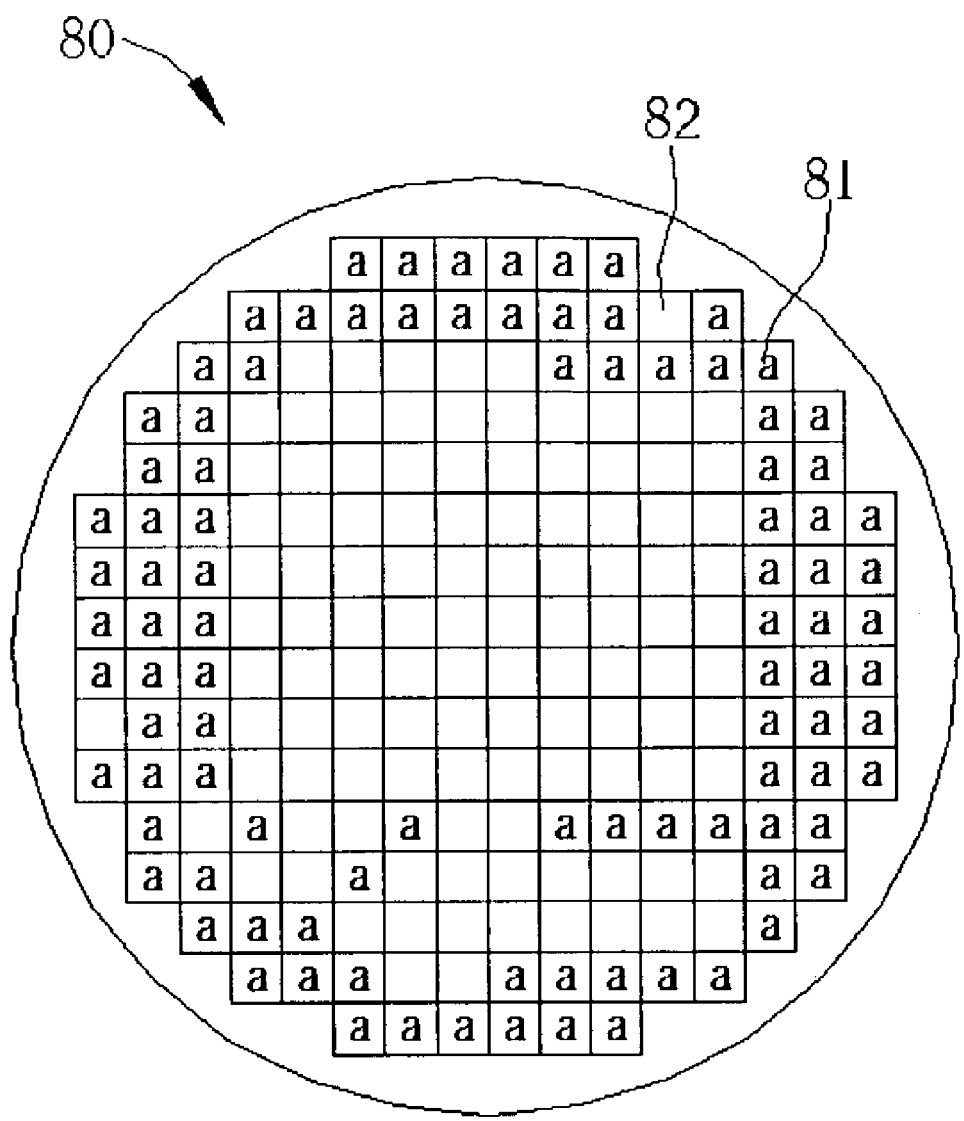
FIG. 8 is the schematic top view of the wafer 80 according to the second embodiment of the present invention.

As shown in FIG. 7, in case that the amount of residual lots of wafers 80 in the low yield group is determined not equal to zero in the step 607 after the step 606, a step 701 is performed to search the results of a plurality of electrical tests performed on each die of each wafer 80 of each lot. In the second embodiment of the present invention, the electrical tests are performed on every layer on every die of every wafer 80. Therefore, electrical test parameters for each layer on each die of each wafer 80 is obtained by the step 701. A step 702 is then performed to define dies failing the electrical tests as target dies marked with the symbol "a", as shown in FIG. 8 of a schematic top view of the wafer 80 according to the second embodiment of the present invention. As shown in FIG. 8, the surface of the wafer 80 comprises a plurality of dies, including multiple target dies 81 marked with the symbol "a", and multiple non-defective dies 82, which are represented by the white blocks in FIG. 8. Therefore, FIG. 8 is also considered a distribution chart of target dies 81 of each wafer 80. Since the electrical tests are performed on every layer on the dies, multiple distribution charts of target dies 81 are obtained in the step 702 regarding each wafer 80. A step 703 is performed thereafter to compare the distribution charts of the target dies 81 in each layer with the distribution charts of wafer test parameters of wafers 80 with defects to obtain a first overlapping ratio of the distribution chart of target dies in each layer to the distribution chart of wafer test parameters of the corresponding wafer 80 with defects.

A step 704 is then performed to determine whether the first overlapping ratio of each wafer 80 is greater than a fourth standard value, such as 30%, so as to define wafers 80 with the first overlapping ratios greater than the fourth value as target wafers in a step 706. Then, a step 707 is performed to determine whether a certain lot of wafers comprises a ratio of target wafers greater than a fifth standard value, and a step 708 is performed to delete lot numbers of lots comprising the ratio of target wafers less than the fifth standard value. Lot numbers of residual lots in the low yield group are kept in a step 709.

Figure 9:
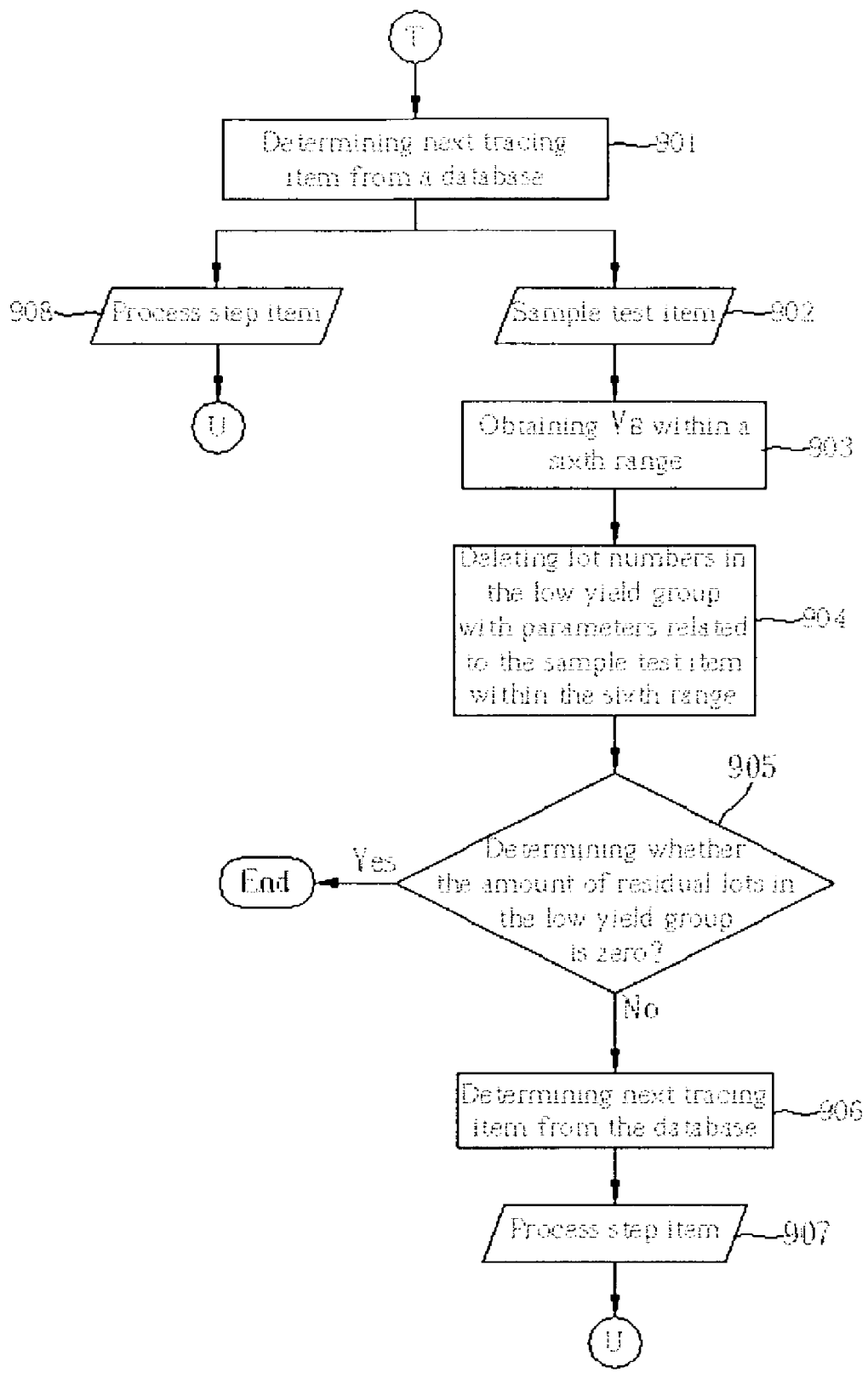

As shown in FIG. 9, a step 901 is then performed by the computer to search the database for sample test items and process steps items related to the wafer test item B and determine the next tracing item. If the wafer test item B is determined to be related to the sample test item 902 in the step 901, a step 903 is performed to analyze the parameters related to the sample test item of the wafers 80 in the high yield group, obtaining a sixth standard value $v_B$ within a sixth range. A step 904 is then performed to compare the parameters of sample test item of each residual lot in the low yield group after the step 707 with the sixth standard value $v_B$, so as to delete lot numbers of residual lots with parameters related to the sample test item within the sixth range. A step 905 is performed thereafter to determine whether the amount of residual lots of the wafers 80 in the low yield group is zero or not. In case that the amount of residual lots of wafers 80 in the low yield group is not equal to zero, it is reasonable to assume that the yield of the residual lots of wafers 80 in the low yield group lower than $K_B$ is due to the failing on the wafer test item B of the residual lots, and this failing on the wafer test item B might be due to the process step item related to the sample test item. A step 906 is therefore performed by either an engineer or a computer to determine the next tracing item according to the database.

Figure 10:
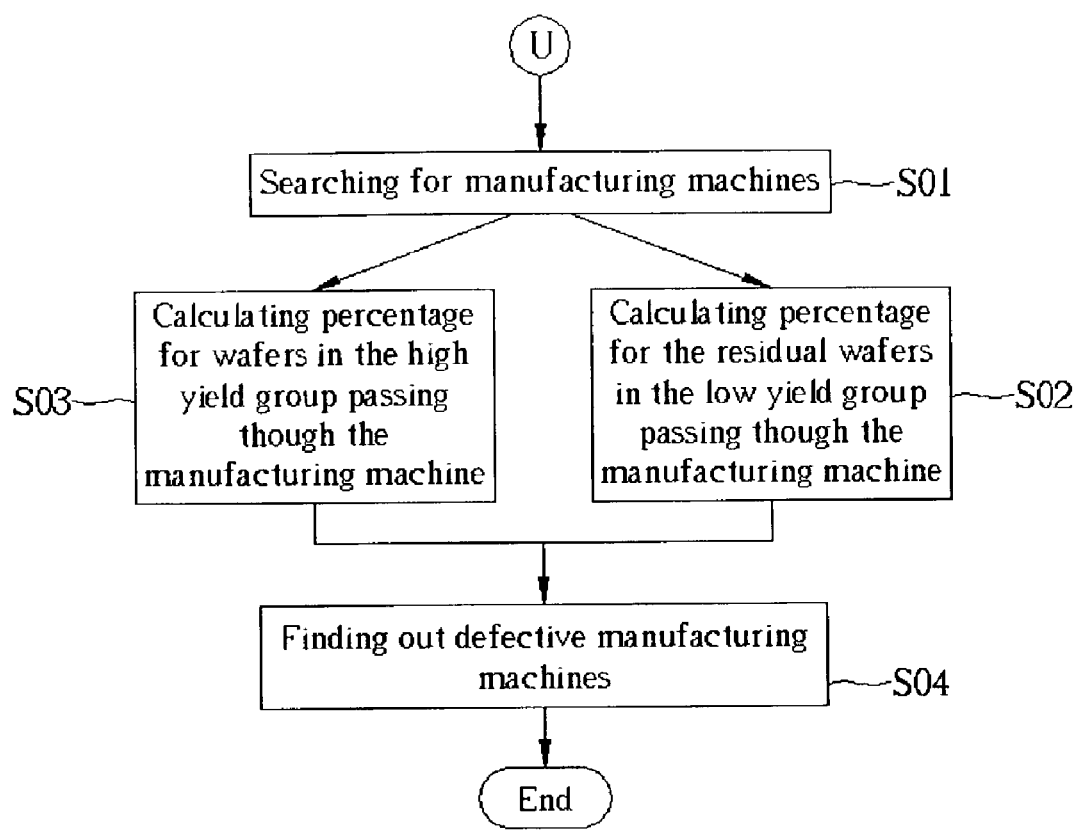

If the sample test item is determined to be related to the process step item 907 in the step 906, or the wafer test item B is determined to be related to the process step item 908 in the step 901, steps S01 to S04 are then performed, as shown in FIG. 10. The steps S01 to S04 shown in FIG. 10 are similar to the steps 501 to 504, and are therefore neglected for simplicity of description.

Figure 11:
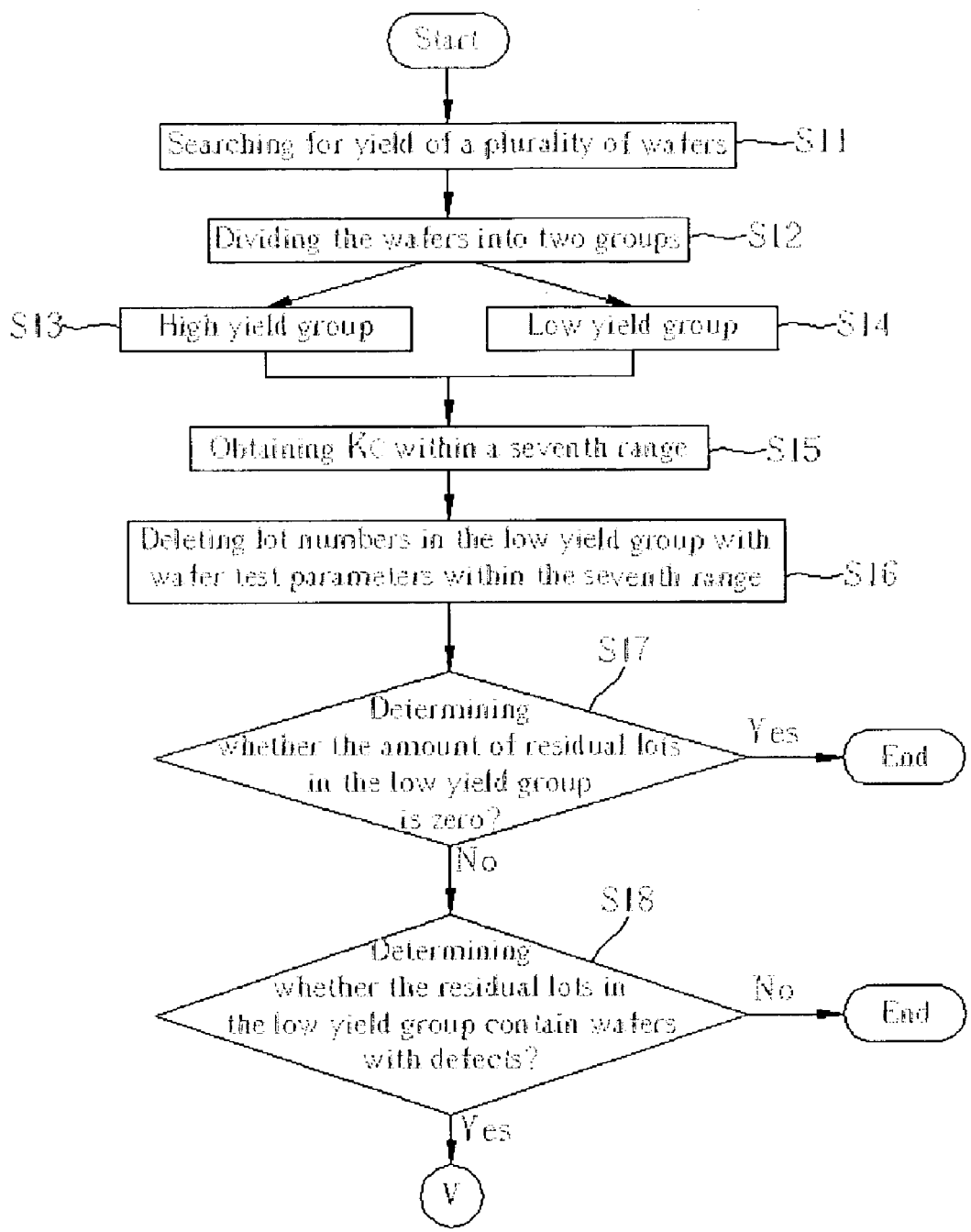
FIG. 11 to FIG. 13 are flow diagrams of the third embodiment of the method for analyzing wafer test parameters of a plurality of lots of wafers according to the present invention.
Figure 12:
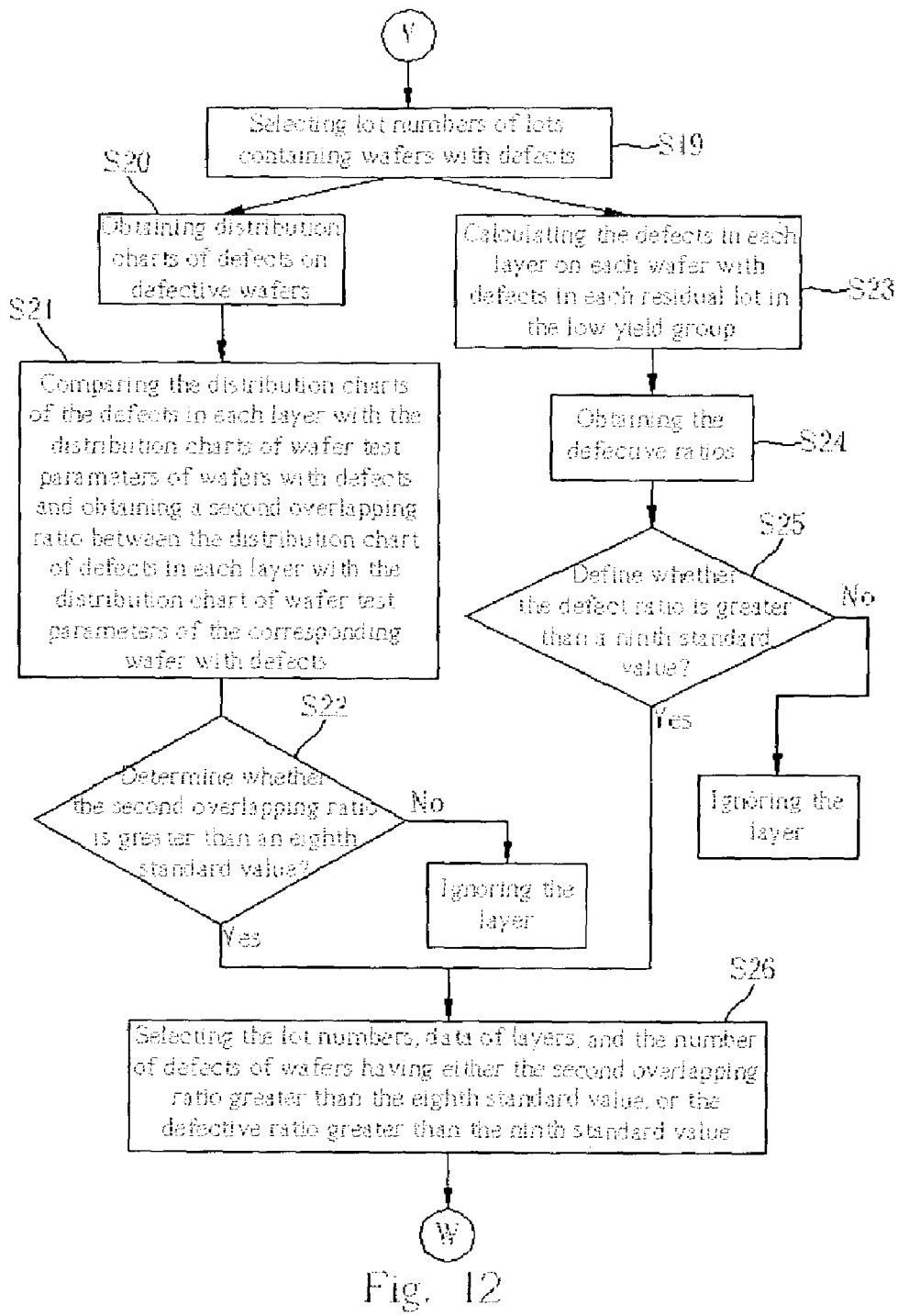
Figure 13:
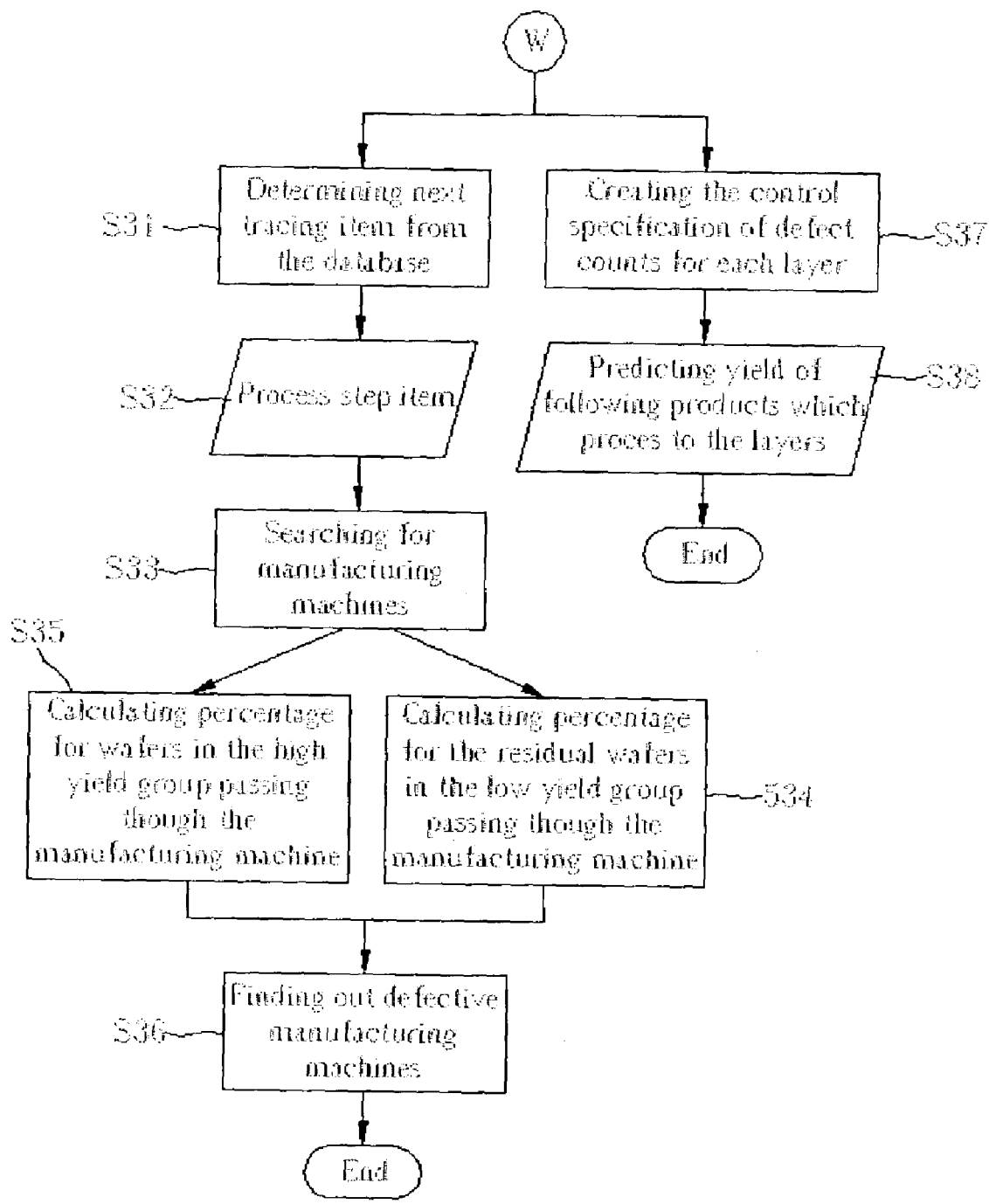

Please refer to FIG. 11 to FIG. 13 of flow diagrams of the third embodiment of a method for analyzing wafer test parameters of a plurality of lots of wafers 80 according to the present invention. As shown in FIG. 11 and FIG. 12, steps S11 to S17 are similar to the steps 301 to 307 shown in FIG. 3, and are therefore neglected for simplicity of description. A step S18 is then performed to search the residual lots of wafers 80 in the low yield group after the step S16 for defects, defining lots containing wafers 80 with defects as defective lots. In response to the number of defective lots not equaling to zero, a step S19 is performed to select lot numbers of lots comprising wafers 80 with defects. By performing a step S20, distribution charts of defects on defective wafers are obtain. Since defects can occur in different layers on a single wafer 80, multiple distribution charts of defects may be obtained regarding any single wafer 80.

A step S21 is performed thereafter to compare the distribution charts of defects in each layer with the distribution charts of wafer test parameters of the corresponding wafers 80 with defects to obtain a second overlapping ratio of the distribution chart of defects in each layer to the distribution chart of wafer test parameters of the corresponding wafer 80 with defects. A step S24 is then performed to determine whether the second overlapping ratio of each wafer 80 is greater than an eighth standard value, such as 50%.

As shown in FIG. 12, a step S23 is simultaneously performed with the step S20 to calculate the numbers of defects in each layer on each wafer with defects in each residual lot in the low yield group. A step 24 is then performed to calculate a defect ratio of the number of defects in each layer on each wafer to the number of non-defective dies on the corresponding wafers 80. Thereafter, a step 25 is performed to define whether the defect ratio is greater than a ninth standard value, such as 50%. A step S26 is then performed to select the lot numbers, data of layers, and the number of defects of wafers having either the second overlapping ratio greater than the eighth standard value, or the defective ratio greater than the ninth standard value.

As shown in FIG. 13, a step S31 is performed to determine the process step item S32 to be the next tracing item regarding the data of layers selected in the step S26. As shown in FIG. 12, steps S33 to S36 are similar to the steps 501 to 504, and are neglected for simplicity of description.

Alternatively, a step S37 is performed after the step S26 to create the control specification for defects during the production of the wafers 80 according to the number of defects of wafers 80 calculated and selected in the step S26. Based on the control specification for defects created in the step S37, a step can be further performed to predict yield of subsequent processes for manufacturing the selected layer in the step S26 shown in FIG. 12.

In comparison with the prior art, the present invention utilizes the high yield group as a control group and stores data of parameters of the wafer test items and the items related to the wafer test items stored in the database. By performing the commonality analyzing method provided in the present invention, the most possible abnormal manufacturing machines and process steps utilized for the production of the wafers with defects are selected. Therefore, misjudgment towards manufacturing machines and process steps made by the unsystematic analyzing method in the prior art is prevented. Consequently, the manufacturing efficiency is improved, and the production cost is reduced as well.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method for analyzing wafer test parameters of a plurality of lots of wafers, each lot of the wafers comprising a lot number, each wafer of each lot comprising at least one wafer test parameter generated by performing at least one wafer test item stored in a database, parameters related to at least one sample test item, one in-line quality control (QC)

item and one process step item related to the wafer test item being stored in the database, the method comprising:

dividing the lots of wafers into at least a high yield group and a low yield group based on yield of the lots;

obtaining a first standard value within a first range by analyzing the wafer test parameters of the wafers in the high yield group;

performing a first comparison step to compare each wafer test parameter of each lot in the low yield group with the first standard value and delete lot numbers of lots with wafer test parameters within the first range;

determining a first amount of residual lots in the low yield group after the first comparison step;

while the first amount of residual lots in the low yield group is not equal to zero, performing the following steps:

performing a first searching step to determine which item of sample test items, in-line QC items and process step items is related to the wafer test item of each residual lot in the low yield group from the database;

when the sample test item is determined to be related to the wafer test item in the first searching step, obtaining a second standard value within a second range by analyzing the parameters related to the sample test item of the wafers in the high yield group;

performing a second comparison step to compare the parameters of sample test item of each residual lot in the low yield group with the second standard value and delete lot numbers of residual lots with parameters related to the sample test item within the second range;

determining a second amount of residual lots in the low yield group after the second comparison step;

while the second amount of residual lots in the low yield group is not equal to zero, performing the following steps:

a second searching step to determine which item of the in-line QC items and the manufacturing machine items is related to the sample test item of each residual lot from the low yield group in the database;

when the in-line QC item is determined to be related to the sample test item in the second searching step, obtaining a third standard value within a third range by analyzing the parameters related to the in-line QC item of the wafers in the high yield group;

performing a third comparison step to compare the parameters of in-line QC item of each residual lot in the low yield group with the third standard value and delete lot numbers of residual lots with the parameters related to the in-line QC item within the third range;

determining a third amount of residual lots in the low yield group after the third comparison step;

while the third amount of residual lots in the low yield group is not equal to zero, performing the following steps:

performing a third searching step to determine the process step item related to the in-line QC item of each residual lot in the low yield group in the database;

when the process step item is determined to be related to the in-line QC item in the third searching step, searching for manufacturing machines utilized for the production of the wafers in the high yield group at the process step;

searching for manufacturing machines utilized for the production of the residual lots of wafers in the low yield group at the process step; and performing a determining process to determine manufacturing machines utilized for producing more wafers included in the residual lots in the low yield group than wafers in the high yield group; and while the third amount of residual lots in the low yield group is equal to zero, stopping performing the third searching step; and while the second amount of residual lots in the low yield group is equal to zero, stopping performing the second searching step; and while the first amount of residual lots in the low yield group is equal to zero, stopping performing the first searching step.

2. The method of claim 1 wherein the determining process is performed by using a commonality analyzing method to determine manufacturing machines utilized for producing more wafers included in the residual lots in the low yield group than wafers in the high yield group.

3. A method for analyzing wafer test parameters of a plurality of lots of wafers, each lot of the wafers comprising a lot number, each wafer of each lot comprising at least one wafer test parameter generated by performing at least one wafer test item stored in a database, the wafer test item comprising a plurality of electrical tests performed on each die of each wafer, the wafer test parameters comprising statistic results of the electrical tests, parameters related to at least one sample test item, one in-line quality control (QC) item and one process step item related to the wafer test item being stored in the database, the method comprising:

dividing the lots of wafers into at least a high yield group and a low yield group based on yield of the lots;

obtaining a first standard value within a first range by analyzing the wafer test parameters of the wafers in the high yield group;

performing a first comparison step to compare each wafer test parameter of each lot in the low yield group with the first standard value and delete lot numbers of lots with wafer test parameters within the first range;

determining a first amount of residual lots in the low yield group after the first comparison step;

while the first amount of residual lots in the low yield group is not equal to zero, performing the following steps:

searching for parameters of the electrical tests performed on each die of each wafer in the low yield group to define dies failing in the electrical tests as target dies and obtain a distribution chart of target dies of each wafer;

comparing the distribution chart of target dies of each wafer with a distribution chart of the wafer test parameters of the corresponding wafer to obtain an overlapping ratio;

marking wafers with the overlapping ratio greater than an second standard value as target wafers;

selecting lot numbers of lots comprising an amount of target wafers greater than a third standard value; and determining which item of the sample test items and the process step items is related to the wafer test item of each residual lot in the low yield group in the database; and while the first amount of residual lots in the low yield group is equal to zero, stopping searching.

4. The method of claim 3 wherein further steps are needed when the sample test item is determined to be related to the wafer test item in the first searching step:
- obtaining a fourth standard value within a second range by analyzing the parameters related to the sample test item of the wafers in the high yield group;
- performing a second comparison step to compare the parameters of sample test item of each residual lot in the low yield group with the fourth standard value and delete lot numbers of residual lots with parameters related to the sample test item within the second range;
- determining a second amount of residual lots in the low yield group after the second comparison step; and
- in response to the second amount of residual lots in the low yield group not equaling to zero, performing a second searching step to determine which item of the process step items is related to the sample test item of each residual lot in the low yield group in the database.

5. The method of claim 4 wherein further steps are needed when the process step item is determined to be related to the sample test item in the second searching step:
- searching for manufacturing machines utilized for the production of the wafers in the high yield group at the process step;
- searching for manufacturing machines utilized for the production of the residual lots of wafers in the low yield group at the process step; and
- performing a determining process to determine manufacturing machines utilized for producing more wafers included in the residual lots in the low yield group than wafers in the high yield group.

6. The method of claim 5 wherein the determining process is performed by using a commonality analyzing method to determine manufacturing machines utilized for producing more wafers included in the residual lots in the low yield group than wafers in the high yield group.

7. The method of claim 3 wherein further steps are needed when the process step item is determined to be related to the wafer test item in the first searching step:
- searching for manufacturing machines utilized for the production of the wafers in the high yield group at the process step;
- searching for manufacturing machines utilized for the production of the residual lots of wafers in the low yield group at the process step; and
- performing a determining process to determine manufacturing machines utilized for producing more wafers included in the residual lots in the low yield group than wafers in the high yield group.

8. The method of claim 7 wherein the determining process is performed by using the commonality analyzing method to determine manufacturing machines utilized for producing more wafers included in the residual lots in the low yield group than wafers in the high yield group.

9. The method of claim 3 wherein further steps are needed when the first amount of residual lots in the low yield group is determined not to be zero:
- determining defects on wafers in the residual lots in the low yield group and recording lot numbers of lots comprising wafers with defects;
- making a distribution chart of defects in a plurality of layers on each wafer with defects in each lot;
- making the distribution chart of the wafer test parameters of each wafer with defects;
- comparing the distribution chart of defects for the plurality of layers with the distribution chart of wafer test parameters of each wafer with defects to obtain an overlapping ratio of the distribution chart of defects in the plurality of layers to the distribution chart of wafer test parameters of each wafer with defects and finding out at least one target layer with a high overlapping ratio; and
- searching the database for the process step item related to the target layer.

10. The method of claim 9 wherein further steps are needed when the target layer is determined to be related to the process step item by searching the database:
- searching for manufacturing machines utilized for the production of the wafers in the high yield group at the process step;
- searching for manufacturing machines utilized for the production of the residual lots of wafers in the low yield group at the process step; and
- performing a determining process to determine manufacturing machines utilized for producing more wafers included in the residual lots in the low yield group than wafers in the high yield group.

11. The method of claim 10 wherein the determining process is performed by using the commonality analyzing method to determine manufacturing machines utilized for producing more wafers included in the residual lots in the low yield group than wafers in the high yield group.

12. The method of claim 9 wherein the method for analyzing wafer test parameters of a plurality of lots of wafers further comprises the following step of:
- obtaining a fourth standard value as defect control specification by statistically analyzing the defects in the target layer.

13. The method of claim 12 wherein the method for analyzing wafer test parameters of a plurality of lots of wafers further comprises the following step of:
- predicting the yield of following products which process to the target layer based on the fourth standard value.

14. The method of claim 3 wherein further steps are needed when the first amount of residual lots in the low yield group is determined not to be zero:
- determining defects on wafers in the residual lots in the low yield group and recording lot numbers of lots comprising wafers with defects;
- making a distribution chart of defects in each layer on each wafer with defects in each lot;
- calculating the defects in each layer on each wafer with defects in each lot;
- analyzing a distribution chart of the wafer test parameters of each wafer with defects;
- comparing the distribution chart of defects in each layer with the distribution chart of wafer test parameters of each wafer with defects to obtain an overlapping ratio of the distribution chart of defects in each layer to the distribution chart of wafer test parameters of each wafer with defects;
- calculating a defect ratio of the number of defects in each layer on each wafer to the number of dies with wafer test parameters not within the first range;
- determining the overlapping ratio;
- while the overlapping ratio is larger than or equal to a fifth standard value, performing the following steps:
  - marking the layer as a first defective layer;
  - determining the defect ratio;
  - while the defect ratio is larger than or equal to a sixth standard value, performing the following steps:
    - marking the layer as a second defective layer;

searching for lot numbers of lots with wafers comprising at least one of either the first defective layer or the second defective layer; and searching the database for the process step item related to either the first defective layer or the second defective layer; and while the defect ratio is less than the sixth standard value, not marking the layer as the second defective layer; and while the overlapping ratio is less than the fifth standard value, not marking the layer as the first defective layer.

15. The method of claim 14 wherein the following steps are needed when the process step item is determined to be related to either the first defective layer or the second defective layer by searching the database:

searching for manufacturing machines utilized for the production of the wafers in the high yield group at the process step;

searching for manufacturing machines utilized for the production of lots of wafers comprising at least one of either the first defective layer or the second defective layer at the process step; and performing a determining process to determine manufacturing machines utilized for producing more wafers comprising at least one of the first defective layer and the second defective layer than wafers in the high yield group.

16. The method of claim 15 wherein the determining process is performed by using the commonality analyzing method to determine manufacturing machines utilized for producing more wafers comprising at least one of the first defective layer and the second defective layer than wafers in the high yield group.

17. The method of claim 14 wherein the method for analyzing wafer test parameters of a plurality of lots of wafers further comprises the following step of:

statistically analyzing the number of defects in at least one of the first defective layer and the second defective layer to obtain a seventh standard value utilized for defect control specification of at least one of the first defective layer and the second defective layer.

18. The method of claim 17 wherein the method for analyzing wafer test parameters of a plurality of lots of wafers further comprises the following step of:

predicting yield of following products which process to either one of the first defective layer or the second defective layer based on the seventh standard value.

19. A method for analyzing wafer test parameters of a plurality of lots of wafers, each lot of the wafers comprising a lot number, each wafer of each lot comprising at least one wafer test parameter generated by performing at least one wafer test item stored in a database, parameters related to at least one sample test item, one in-line quality control (QC) item and one process step item related to the wafer test item being stored in the database, the method comprising:

dividing the lots of wafers into at least a high yield group and a low yield group based on yield of the lots;

obtaining a first standard value within a first range by analyzing the wafer test parameters of the wafers in the high yield group;

performing a first comparison step to compare each wafer test parameter of each lot in the low yield group with the first standard value and delete lot numbers of lots with wafer test parameters within the first range;

determining a first amount of residual lots in the low yield group after the first comparison step;

while the first amount of residual lots in the low yield group is not equal to zero, performing the following steps:

performing a first searching step to determine which item of sample test items, in-line QC items and process step items is related to the wafer test item of each residual lot in the low yield group from the database;

when the in-line QC item is determined to be related to the wafer test item in the first searching step, obtaining the third standard value within the third range by analyzing the parameters related to the in-line QC item of the wafers in the high yield group;

performing the third comparison step to compare the parameters of in-line QC item of each residual lot in the low yield group with the third standard value and delete lot numbers of residual lots with the parameters related to the in-line QC item within the third range;

determining the third amount of residual lots in the low yield group after the third comparison step;

while the third amount of residual lots in the low yield group is not equal to zero, performing the following steps:

performing the third searching step to determine which item of the process step items is related to the in-line QC item of each residual lot in the low yield group in the database;

when the process step item is determined to be related to the in-line QC item in the third searching step, searching for manufacturing machines utilized for the production of the wafers in the high yield group at the process step;

searching for manufacturing machines utilized for the production of the residual lots of wafers in the low yield group at the process step; and performing a determining process to determine manufacturing machines utilized for producing more wafers included in the residual lots in the low yield group than wafers in the high yield group; and while the third amount of residual lots in the low yield group is equal to zero, stopping performing the third searching step; and while the first amount of residual lots in the low yield group is equal to zero, stopping performing the first searching step.

20. The method of claim 19 wherein the determining process is performed by using the commonality analyzing method to determine manufacturing machines utilized for producing more wafers included in the residual lots in the low yield group than wafers in the high yield group.

21. A method for analyzing wafer test parameters of a plurality of lots of wafers, each lot of the wafers comprising a lot number, each wafer of each lot comprising at least one wafer test parameter generated by performing at least one wafer test item stored in a database, parameters related to at least one sample test item, one in-line quality control (QC) item and one process step item related to the wafer test item being stored in the database, the method comprising:

dividing the lots of wafers into at least a high yield group and a low yield group based on yield of the lots;

obtaining a first standard value within a first range by analyzing the wafer test parameters of the wafers in the high yield group;

performing a first comparison step to compare each wafer test parameter of each lot in the low yield group with the first standard value and delete lot numbers of lots with wafer test parameters within the first range;

determining a first amount of residual lots in the low yield group after the first comparison step;

while the first amount of residual lots in the low yield group is not equal to zero, performing the following steps:

performing a first searching step to determine which item of sample test items, in-line QC items and process step items is related to the wafer test item of each residual lot in the low yield group from the database;

when the process step item is determined to be related to the wafer test item in the first searching step, performing the following steps:

searching for manufacturing machines utilized for the production of the wafers in the high yield group at the process step;

searching for manufacturing machines utilized for the production of the residual lots of wafers in the low yield group at the process step; and performing a determining process to determine manufacturing machines utilized for producing more wafers included in the residual lots in the low yield group than wafers in the high yield group; and while the first amount of residual lots in the low yield group is equal to zero, stopping performing the first searching step.

22. The method of claim 21 wherein the determining process is performed by using the commonality analyzing method to determine manufacturing machines utilized for producing more wafers included in the residual lots in the low yield group than wafers in the high yield group.

23. A method for analyzing wafer test parameters of a plurality of lots of wafers, each lot of the wafers comprising a lot number, each wafer of each lot comprising at least one wafer test parameter generated by performing at least one wafer test item stored in a database, parameters related to at least one sample test item, one in-line quality control (QC) item and one process step item related to the wafer test item being stored in the database, the method comprising:

dividing the lots of wafers into at least a high yield group and a low yield group based on yield of the lots;

obtaining a first standard value within a first range by analyzing the wafer test parameters of the wafers in the high yield group;

performing a first comparison step to compare each wafer test parameter of each lot in the low yield group with the first standard value and delete lot numbers of lots with wafer test parameters within the first range;

determining a first amount of residual lots in the low yield group after the first comparison step;

while the first amount of residual lots in the low yield group is not equal to zero, performing the following steps:

performing a first searching step to determine which item of sample test items, in-line QC items and process step items is related to the wafer test item of each residual lot in the low yield group from the database;

when the first amount of residual lots in the low yield group is determined not to be zero, determining defects on wafers in the residual lots in the low yield group and recording lot numbers of lots comprising wafers with defects;

making a distribution chart of defects in a plurality of layers on each wafer with defects in each lot;

making a distribution chart of the wafer test parameters of each wafer with defects;

comparing the distribution chart of defects for the plurality of layers with the distribution chart of wafer test parameters of each wafer with defects to obtain an overlapping ratio of the distribution chart of defects in the plurality of layers to the distribution chart of wafer test parameters of each wafer with defects and finding out at least one target layer with a high overlapping ratio; and searching the database for the process step item related to the target layer; and while the first amount of residual lots in the low yield group is equal to zero, stopping performing the first searching step.

24. The method of claim 23 wherein further steps are needed when the target layer is determined to be related to the process step item by searching the database:

searching for manufacturing machines utilized for the production of the wafers in the high yield group at the process step;

searching for manufacturing machines utilized for the production of the residual lots of wafers in the low yield group at the process step; and performing a determining process to determine manufacturing machines utilized for producing more wafers included in the residual lots in the low yield group than wafers in the high yield group.

25. The method of claim 24 wherein the determining process is performed by using the commonality analyzing method to determine manufacturing machines utilized for producing more wafers included in the residual lots in the low yield group than wafers in the high yield group.

26. The method of claim 23 wherein the method for analyzing wafer test parameters of a plurality of lots of wafers further comprises the following step of:

obtaining a fourth standard value as a control specification by statistically analyzing the defect counts in the target layer.

27. The method of claim 26 wherein the method for analyzing wafer test parameters of a plurality of lots of wafers further comprises the following step of:

predicting the yield of following products which process to the target layer based on the fourth standard value.

28. A method for analyzing wafer test parameters of a plurality of lots of wafers, each lot of the wafers comprising a lot number, each wafer of each lot comprising at least one wafer test parameter generated by performing at least one wafer test item stored in a database, parameters related to at least one sample test item, one in-line quality control (QC) item and one process step item related to the wafer test item being stored in the database, the method comprising:

dividing the lots of wafers into at least a high yield group and a low yield group based on yield of the lots;

obtaining a first standard value within a first range by analyzing the wafer test parameters of the wafers in the high yield group;

performing a first comparison step to compare each wafer test parameter of each lot in the low yield group with the first standard value and delete lot numbers of lots with wafer test parameters within the first range;

determining a first amount of residual lots in the low yield group after the first comparison step;

while the first amount of residual lots in the low yield group is not equal to zero, performing the following steps:

performing a first searching step to determine which item of sample test items, in-line QC items and process step items is related to the wafer test item of each residual lot in the low yield group from the database;

when the first amount of residual lots in the low yield group is determined not to be zero, determining defects on wafers in the residual lots in the low yield group and recording lot numbers of lots comprising wafers with defects;

making a distribution chart of defects in each layer on each wafer with defects in each lot;

calculating the defects in each layer on each wafer with defects in each lot;

analyzing a distribution chart of the wafer test parameters of each wafer with defects;

comparing the distribution chart of defects in each layer with the distribution chart of wafer test parameters of each wafer with defects to obtain an overlapping ratio of the distribution chart of defects in each layer to the distribution chart of wafer test parameters of each wafer with defects;

calculating a defect ratio of the number of defects in each layer on each wafer to the number of dies with wafer test parameters not within the first range;

determining the overlapping ratio;

while the overlapping ratio is larger than or equal to a fifth standard value, performing the following steps:
  marking the layer as a first defective layer;
  determining the defect ratio;
  while the defect ratio is larger than or equal to a sixth standard value,
  performing the following steps:
  marking the layer as a second defective layer;
  searching for lot numbers of lots with wafers comprising at least one of either the first defective layer or the second defective layer; and
  searching the database for the process step item related to either the first defective layer or the second defective layer; and
while the defect ratio is less than the sixth standard value, not marking the layer as the second defective layer; and
while the overlapping ratio is less than the fifth standard value, not marking the layer as the first defective layer; and
while the first amount of residual lots in the low yield group is equal to zero, stopping performing the first searching step.

29. The method of claim 28 wherein the following steps are needed when the process step item is determined to be related to either the first defective layer or the second defective layer by searching the database:
  searching for manufacturing machines utilized for the production of the wafers in the high yield group at the process step;
  searching for manufacturing machines utilized for the production of lots of wafers comprising at least one of either the first defective layer or the second defective layer at the process step; and
  performing a determining process to determine manufacturing machines utilized for producing more wafers comprising at least one of the first defective layer and the second defective layer than wafers in the high yield group.

30. The method of claim 29 wherein the determining process is performed by using the commonality analyzing method to determine manufacturing machines utilized for producing more wafers comprising at least one of the first defective layer and the second defective layer than wafers in the high yield group.

31. The method of claim 28 wherein the method for analyzing wafer test parameters of a plurality of lots of wafers further comprises the following step of:
  statistically analyzing the number of defects in at least one of the first defective layer and the second defective layer to obtain a seventh standard value utilized for defect control specification of at least one of the first defective layer and the second defective layer.

32. The method of claim 31 wherein the method for analyzing wafer test parameters of a plurality of lots of wafers further comprises the following step of:
  predicting the yield of following products which process to the first defective layer or the second defective layer based on the seventh standard value.

* * * * *